United States Patent [19]

Motta

[11] Patent Number: 4,892,615
[45] Date of Patent: Jan. 9, 1990

[54] METHOD FOR DECONTAMINATION OF A CHAMBER USED IN VACUUM PROCESSES FOR DEPOSITION, ETCHING AND/OR GROWTH OF HIGH PURITY FILMS

[75] Inventor: Antonino Motta, Milan, Italy

[73] Assignee: SGS Microelettronica S.p.A., Catania, Italy

[21] Appl. No.: 127,952

[22] Filed: Dec. 2, 1987

[30] Foreign Application Priority Data

Dec. 2, 1986 [IT] Italy ................. 22532 A/86

[51] Int. Cl.$^4$ ................. B44C 1/22; B05D 3/06; C23C 14/00

[52] U.S. Cl. ................. 156/643; 118/715; 118/50; 156/345; 204/298

[58] Field of Search ............ 427/38, 39; 156/643, 156/646, 345; 204/192.1, 192.12, 192.32, 298; 118/715, 50, 50.1, 620; 437/83

[56] References Cited

U.S. PATENT DOCUMENTS 3,170,859 2/1965 Boudart et al. ............ 437/83 X
4,421,576 12/1983 Jolly ............ 437/85 X
4,687,542 8/1987 Davis et al. ............ 156/345 X

OTHER PUBLICATIONS

Journal of the Electrochemical Society, vol. 132, No. 3, Mar. 1985, pp. 642–648.
Patent Abstracts of Japan, vol. 10, No. 283, Sep. 26, 1986.
Patent Abstracts of Japan, vol. 7, No. 123, May 27, 1983.

Primary Examiner—William A. Powell
Attorney, Agent, or Firm—Birch, Stewart, Kolasch & Birch

[57] ABSTRACT

A decontamination system for processes for deposition, etching and/or growth of high purity films, particularly applicable to semiconductor technology.

After introducing the products concerned with a process into a chamber and after creating a vacuum in the chamber, the chamber is decontaminated by a series of intermittent inflows of non-contaminating gas and subsequent pressure varying operations.

5 Claims, 5 Drawing Sheets

METHOD FOR DECONTAMINATION OF A CHAMBER USED IN VACUUM PROCESSES FOR DEPOSITION, ETCHING AND/OR GROWTH OF HIGH PURITY FILMS

BACKGROUND OF THE INVENTION

This invention concerns a method for decontaminating chambers used in vacuum processes for deposition, etching and/or growth of high purity films, particularly applicable in semiconductor technology and, specifically, in processes for the deposition, etching and/or growth of films on semiconductor wafers.

In the technology of semiconductor devices, use is preferably made, for deposition, etching or growth of films, of vacuum processes in order to reduce the presence of contaminating substances in the chambers where the processes take place, and consequently to improve the chemico-physical and stoichiometric characteristics of the films obtained. Use is made in particular of systems such as Low Pressure Chemical Vapor Deposition (LPCVD), Plasma Enhanced CVD (PECVD), evaporation, sputtering, Reactive Ion Etching (RIE), systems for etching in plasma, etc.

A known procedure relating to a vacuum process for deposition or etching of films, generally begins with creation of a vacuum in the chamber until a certain minimum pressure level is reached (about 1-25 milliTorr), followed by decontamination of the chamber by allowing non-contaminating gas to flow in at low pressure (e.g. 200 milliTorr) for a previously set time (between 10 and 40 minutes). Then, having once more brought the vacuum down to a certain minimum value, the deposition or the etching processes is begun. Although this method appreciably lessens the presence of undesired gases in the chamber (such as H, $H_2$, $CO_2$, OH, $H_2O$, etc.) it, however, fails to reduce it below certain desired limits.

SUMMARY OF THE INVENTION

The method of decontamination which is the subject of the present invention, is directed at appreciably reducing—leaving unchanged the overall decontaminating time—the presence of most of the contaminants below the limit values referred to above, adhering advantages as far as concerns the chemico-physical and stoichiometric characteristics of the products obtained thereby, such advantages being, for example, reduction of current leakage in insulating films, more efficient film gettering, reduction of the non-stoichiometric zones in the films, more uniform etching, greater possibility of reproducing the effects obtained by etching the films, etc.

For this purpose, after placing the products in the chamber for processing but before the process is started, the decontamination method requires creation of a vacuum, to a certain minimum level of pressure, inside the chamber (hereinafter, for simplicity, this first step will be called "pumping"), and then decontamination by flowing in non-contaminating gas at a pressure suitably higher than the above minimum level (hereinafter, for simplicity, this second step will be called "purging"), this method being characterized in that the flow of non-contaminating gas is intermittent, the decontamination being achieved by a series of purgings, each purging being followed by a pumping.

BRIEF DESCRIPTION OF DRAWINGS

These and other characteristics of the invention will be made clearer by the description that follows and by the attached drawings illustrating an example of its realization of a non-limiting kind, in which the various figures show.

DETAILED DESCRIPTION

Figure 1:
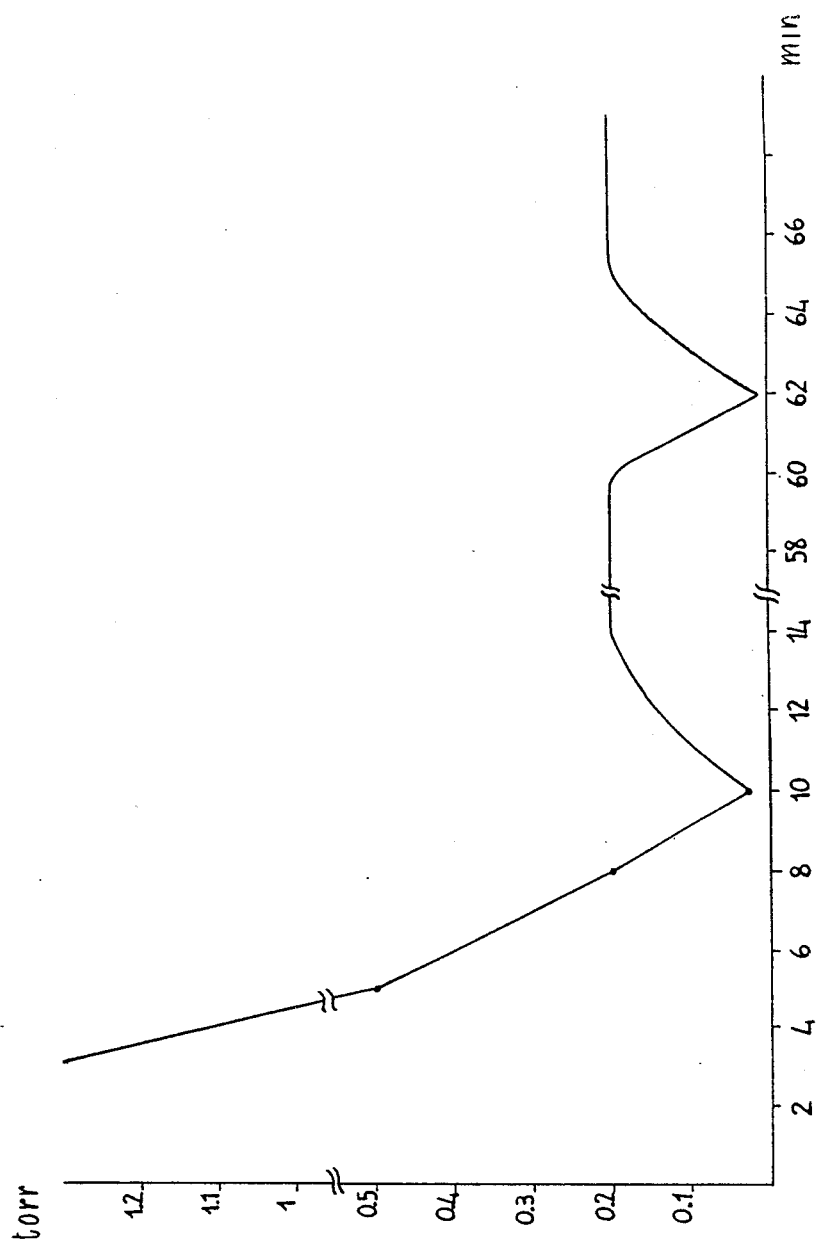
FIG. 1: diagram of a known process of deposition or etching of films in a vacuum.

The diagram in FIG. 1 concerns an example of an already known process of deposition or etching of a film. According to this example, after the wafers have been placed in the chamber at atmospheric pressure where the process takes place, the chamber consisting, for example, of a cylindrical body with quartz walls, heated from the outside, a vacuum is created by rotary pumps assisted, if necessary, by Roots pumps. When the pressure has been reduced to about 25 mTorr, in roughly 10 minutes, the decontamination process begins, lasting for about 50 minutes, and, during this, nitrogen is flowed into the chamber. A system that regulates the opening of the $N_2$ outflow valves ensures that when the pressure has risen to about 200 mTorr, it remains constant at that level for about 45 minutes. When this time has passed, the $N_2$ outflow valve is closed and the pump for creating and maintaining the vacuum reduces when the pressure once more. Pressure has fallen to about 12 mTorr, the valves controlling inflow of the gases used for deposition or etching of the film are opened and the process begins.

Figure 2:
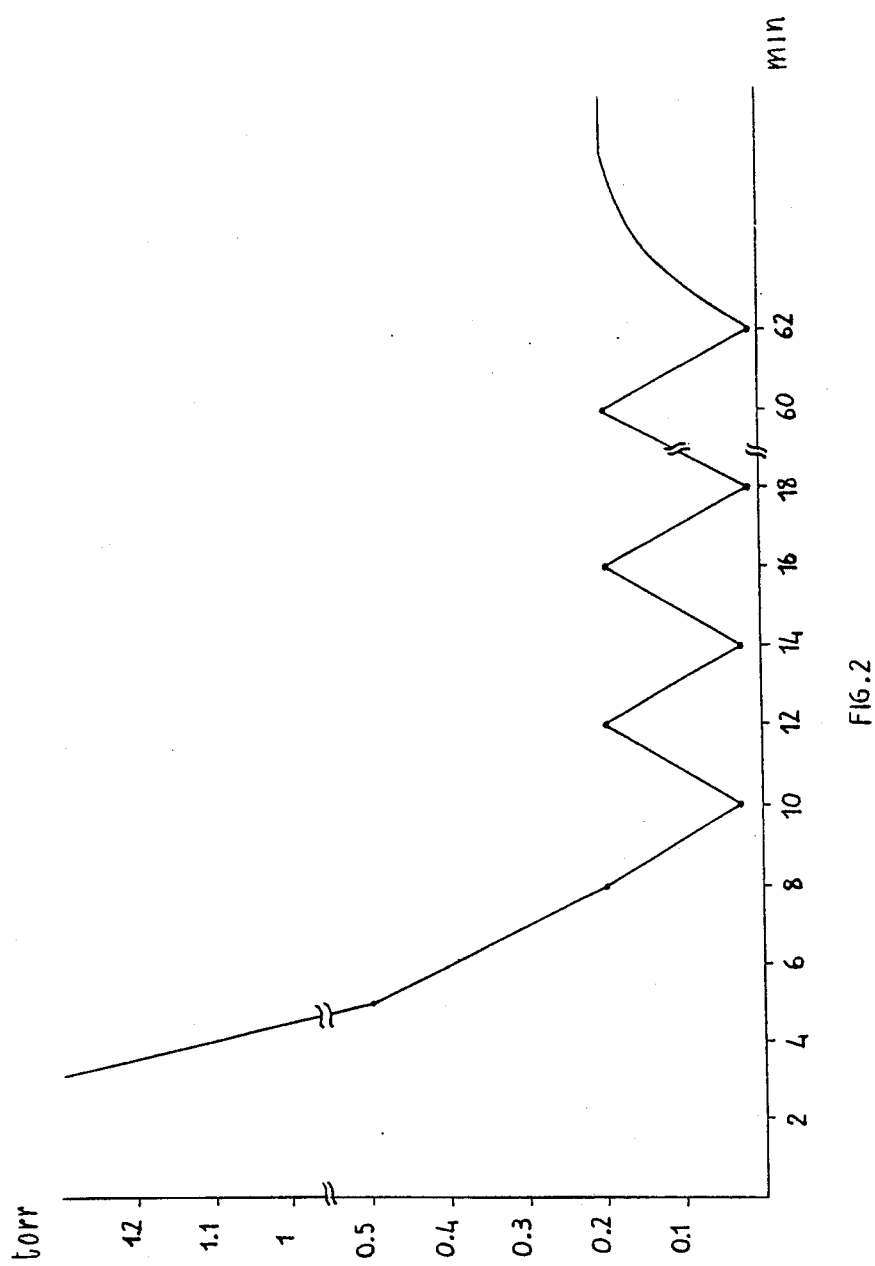
FIG. 2: diagram of a process of deposition or etching of films according to the invention.

The diagram in FIG. 2 illustrates an example of a deposition or etching process according to the invention. In the process, the initial stage consisting of placing wafers in the chamber and subsequent creation of a vacuum therein, is exactly the same as that for FIG. 1. When the pressure has fallen to about 25 mTorr. the decontamination process starts with flowing in of $N_2$, lasting about 50 minutes. Contrary to the preceding case, however, the $N_2$ inflow valve is alternately opened and closed at regular time intervals of about 2 minutes, giving rise to a series of 13 purgings and subsequent pumpings, and to a pressure graph rising and falling between about 200 mTorr and 25 mTorr, except for the last cycles of the series when the minimum pressure drops to about 12 mTorr. The decontamination process is therefore followed by the process of deposition and/or etching of a film similarly to what happens in the case of FIG. 1.

Figure 3:
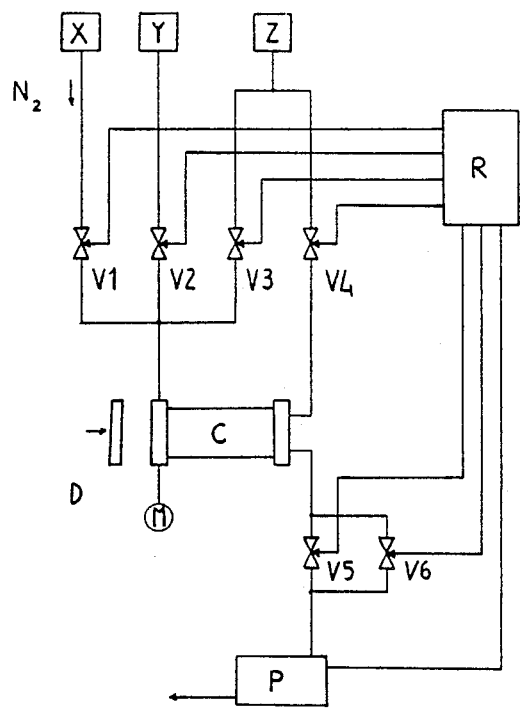
FIG. 3: diagram of a unit functioning according to the process in FIG. 2.

FIG. 3 gives a schematic example of a layout of a low pressure system for deposition or etching of films according to the invention.

The system comprises a chamber C in which the deposition process takes place, a pump P for creating and maintaining low pressure in C, a nitrogen container X, containers Y and Z for the reagent gases used during the deposition or etching process of the film, valves V1, V2, V3 and V4 for regulating gas flow, valves V5 and V6 for regulating gas flow out of chamber C, a gauge M for measuring pressure inside C and, finally a unit R for controlling and regulating gas flow and pressure in C. When the process starts the wafers are already inside C, the pump P is working and the door D to the chamber is closed as are all the valves V1, V2, ..., V6. Valve 6, a half-gate valve, is then opened and this connects the chamber C to the pump; the valve is kept open for about 5 minutes while the pressure falls from 760 Torr to about 500 mTorr. At this point valve V6 is closed and valve 5 (gate valve) is opened enabling a stronger vacuum to be obtained. After 5 more minutes, when the pressure has fallen to about 25 mTorr, leaving valve V5 still open, valve V1 is opened allowing $N_2$ to enter the chamber. After about 2 minutes when the pressure has risen to about 200 mTorr (this value coinciding with the pressure chosen for carrying out the next deposition or the next etching), valve V1 is closed again and kept closed for another 2 minutes until pressure has once more dropped to the minimum level (about 25 mTorr). This first purging and pumping is followed by 12 purging and pumping cycles (all done in a substantially similar manner except for the last pumping when pressure falls to a minimum of about 12 mTorr), after which the decontamination process is completed and a start is made with the process of deposition or etching by opening valves V2, V4 and V3.

Figure 4A:
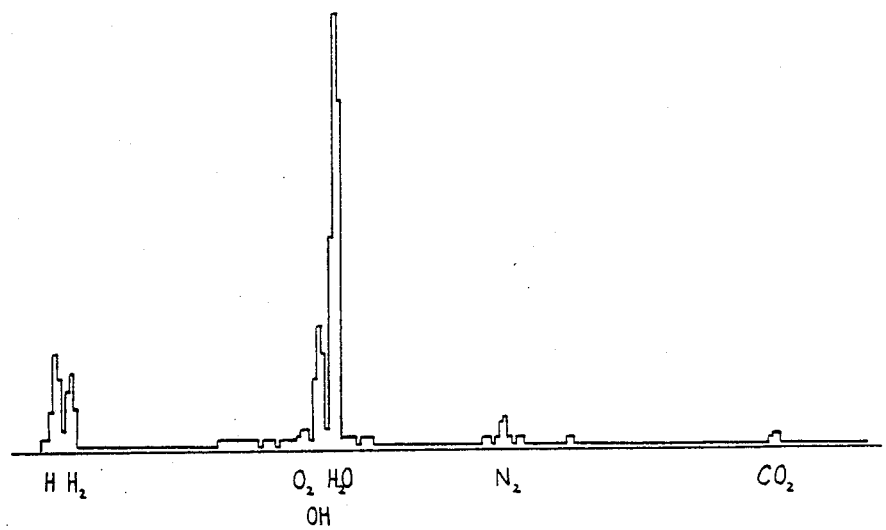
FIGS. 4A and 4B: diagrams showing levels of contamination noted at the end of two decontamination processes executed by the known technique.
Figure 4B:
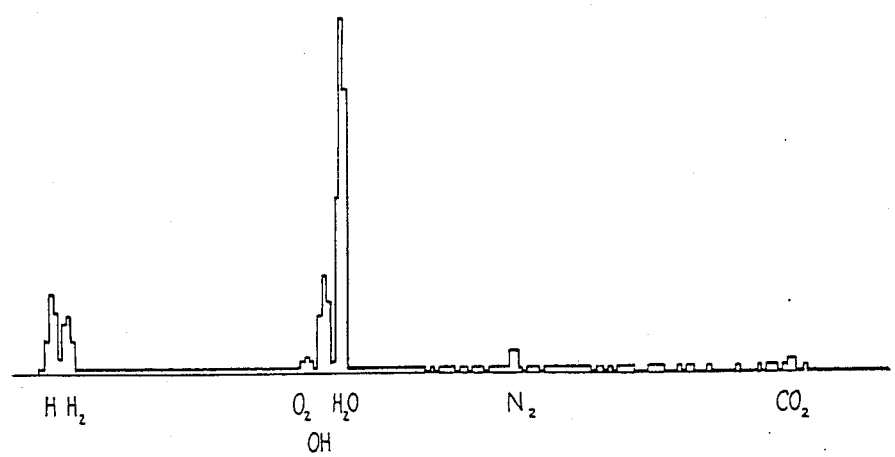

To enable an evaluation to be made of the appreciable reduction of contaminants realized by the invention, in FIGS. 4A and 4B will be seen diagrams showing the concentrations recorded by a mass spectrometer (of the Residual Gas Analysis—RGA—type) after a decontamination process of the conventional kind, respectively carried out in a chamber for deposition of a polycrystal silicon film (FIG. 4A) and in a chamber for deposition of a silicon nitride film (FIG. 4B).

Figure 5A:
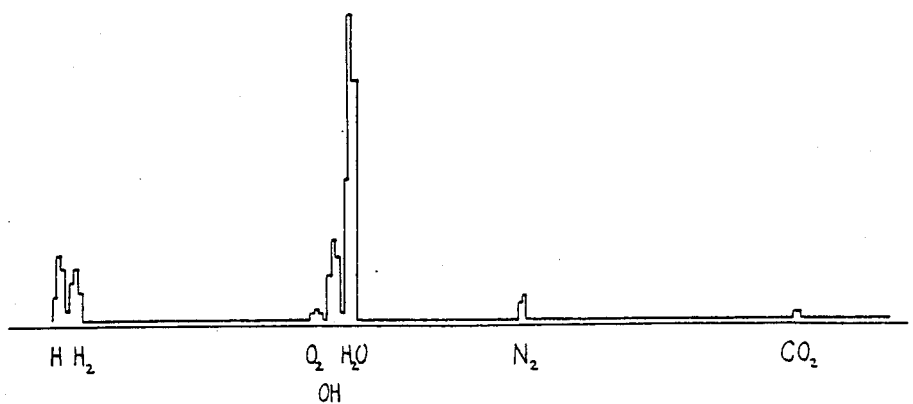
FIGS. 5A and 5B: diagrams showing levels of contamination noted at the end of two decontamination processes executed according to the invention.
Figure 5B:
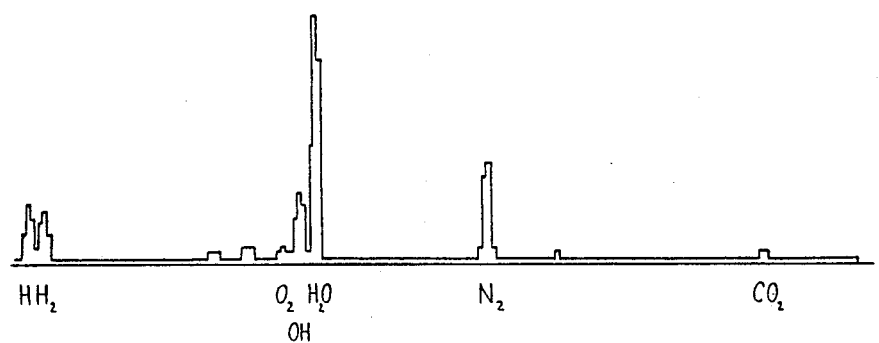

FIGS. 5A and 5B however show diagrams relating to the concentrations found in those same chambers when (other conditions and particularly the time taken being equal) decontamination is done according to the present invention, FIG. 5A relating to the chamber for deposition of the polycrystal silicon film, and 5B to the chamber for deposition of silicon nitride film. In the case of FIG. 5A the diagram brings out the decrease D in concentration of the various polluting substances, these values being:

D(H)=26.2%; D($H_2$)=22.9%; D($O_2$)=0%;
D(OH)=27.8%; D($H_2O$)=27.6%; D($CO_2$)=0%;
while in the case of FIG. 5B there was a decrease in the following values:
D(H)=24%; D($H_2$)=25%; D($O_2$)=0%;
D(OH)=27.9%; D($H_2O$)=29.8%; D($CO_2$)=0%.

In the example of realization described above reference has been made to a particular low pressure system and to the use of nitrogen in the decontamination process. The same method can however be applied both in connection with all the possible gases normally used for the purpose, and in connection with the various vacuum systems operating at pressures in the region of milliTorr (LPCVD, PECVD, evaporation, sputtering, RIE, for etching in plasma systems, etc.) or at pressures in the region of Torr (systems for the growth of epitaxial layers of silicon, etc.).

Further, this example is not to be considered as limited to semiconductor technology as it is obviously applicable to all the vacuum processes that concern deposition, etching and/or growth of high purity films.

I claim:

1. A method for decontamination of a chamber used in vacuum processes for deposition, etching and/or growth of high purity films which comprises:
   introducing into a chamber products to be processed as high purity films,
   creating a vacuum in said chamber containing said products by pumping so that the pressure in said chamber is reduced to a first minimum pressure value of at least about 25 mTorr,
   purging said chamber by introducing therein a non-contaminating gas until a second pressure is reached higher than said first minimum value pressure,
   and repeating the above purging and pumping steps, such that the flow of said non-contaminating gas is intermittent and decontamination is realized by said series of purgings and pumping steps.

2. The method of claim 1, wherein each purging and each pumping operation in the above series is started as soon as pressure inside the chamber has reached a predetermined minimum and respectively maximum value.

3. A system for vacuum processes of deposition, etching and/or growth of high purity films to be applied particularly to semiconductor technology which includes means for introduction into a chamber products to be processed as high purity films, pumping means for creating a vacuum in said chamber to a first minimum pressure value of at least about 25 mTorr and purging means capable of subsequently decontaminating said chamber by introduction of a flow of non-contaminating gas until a value of a second pressure is reached higher than said first minimum value wherein said purging and pumping means cause the flow of said non-contaminating gas to be intermittent, decontamination being realized by a series of purgings each one followed by a pumping.

4. The system of claim 3, wherein said purging and pumping means regulate said series of purgings and subsequent pumpings in such a way that each purging and pumping operation begins as soon as pressure inside said chamber has reached a predetermined minimum and respectively maximum value.

5. A system for vacuum processes of deposition, etching and/or growth of high purity films to be applied particularly to semiconductor technology which includes means for introduction into a chamber products to be processed as high purity films, a pump for creating a vacuum in said chamber to a first minimum pressure value of at least about 25 mTorr and a valve system capable of subsequently decontaminating said chamber by introduction of a flow of non-contaminating gas until a value of a second pressure is reached higher than said first minimum value wherein said pump and valve system cause the flow of said non-contaminating gas to be intermittent, decontamination being realized by a series of purgings each one followed by a pumping.

* * * * *